(12) United States Patent
Yilmaz et al.

(10) Patent No.: US 9,653,383 B2
(45) Date of Patent: May 16, 2017

(54) SEMICONDUCTOR DEVICE WITH THICK BOTTOM METAL AND PREPARATION METHOD THEREOF

(71) Applicant: Alpha and Omega Semiconductor Incorporated, Sunnyvale, CA (US)

(72) Inventors: Hamza Yilmaz, Saratoga, CA (US); Yan Xun Xue, Los Gatos, CA (US); Jun Lu, San Jose, CA (US); Ming-Chen Lu, Shanghai (CN); Yan Huo, Shanghai (CN); Aihua Lu, Shanghai (CN)

(73) Assignee: Alpha & Omega Semiconductor (Cayman), Ltd., Sunnyvale, CA (US)

( * ) Notice: Subject to any disclaimer, the term of this patent is extended or adjusted under 35 U.S.C. 154(b) by 0 days.

(21) Appl. No.: 14/738,271

(22) Filed: Jun. 12, 2015

(65) Prior Publication Data
US 2015/0279766 A1 Oct. 1, 2015

Related U.S. Application Data

(62) Division of application No. 13/797,440, filed on Mar. 12, 2013, now Pat. No. 9,087,828.

(51) Int. Cl.
*H01L 23/495* (2006.01)
*H01L 23/00* (2006.01)
(Continued)

(52) U.S. Cl.
CPC ...... *H01L 23/49503* (2013.01); *H01L 21/561* (2013.01); *H01L 21/566* (2013.01); *H01L 23/3121* (2013.01); *H01L 23/3185* (2013.01); *H01L 23/4334* (2013.01); *H01L 23/492* (2013.01); *H01L 23/49541* (2013.01); *H01L 23/49568* (2013.01); *H01L 24/14* (2013.01);

*H01L 24/97* (2013.01); *H01L 21/6836* (2013.01); *H01L 24/05* (2013.01); *H01L 24/11* (2013.01); *H01L 24/13* (2013.01); *H01L 2224/0401* (2013.01); *H01L 2224/04026* (2013.01); *H01L 2224/056* (2013.01); *H01L 2224/05644* (2013.01); *H01L 2224/1184* (2013.01); *H01L 2224/1191* (2013.01); *H01L 2224/13022* (2013.01); *H01L 2224/13111* (2013.01); *H01L 2224/13147* (2013.01);
(Continued)

(58) Field of Classification Search
CPC ......... H01L 23/49506; H01L 23/49586; H01L 24/10
USPC .......................................... 257/676; 438/118
See application file for complete search history.

(56) References Cited

U.S. PATENT DOCUMENTS

| | | |
|---|---|---|
| 2003/0052405 A1 | 3/2003 | Moriguchi |
| 2012/0104580 A1 | 5/2012 | Feng et al. |
| 2013/0037917 A1* | 2/2013 | Xue .................... H01L 23/3114 257/621 |

FOREIGN PATENT DOCUMENTS

WO  WO2011059205 A2  5/2011

* cited by examiner

*Primary Examiner* — Theresa T Doan
(74) *Attorney, Agent, or Firm* — Lance A. Li; Chein-Hwa Tsao; 5Suns (57) ABSTRACT

A semiconductor device with thick bottom metal comprises a semiconductor chip covered with a top plastic package layer at its front surface and a back metal layer at its back surface, the top plastic package layer surrounds sidewalls of the metal bumps with a top surface of the metal bumps exposing from the top plastic package layer, a die paddle for the semiconductor chip to mount thereon and a plastic package body.

4 Claims, 10 Drawing Sheets

(51) Int. Cl.
  *H01L 23/433* (2006.01)
  *H01L 23/492* (2006.01)
  *H01L 23/31* (2006.01)
  *H01L 21/56* (2006.01)
  *H01L 21/683* (2006.01)
(52) U.S. Cl.
  CPC .............. *H01L 2224/2919* (2013.01); *H01L 2224/32245* (2013.01); *H01L 2224/73253* (2013.01); *H01L 2224/94* (2013.01); *H01L 2224/97* (2013.01); *H01L 2924/1306* (2013.01); *H01L 2924/13091* (2013.01)

SEMICONDUCTOR DEVICE WITH THICK BOTTOM METAL AND PREPARATION METHOD THEREOF

CROSS-REFERENCE TO RELATED APPLICATIONS

This application is a divisional application of a co-pending U.S. Utility Patent application Ser. No. 13/797,440. This application seeks priority to application Ser. No. 13/797,440 filed on Mar. 12, 2013 by common inventors of this Application; the entire contents of the disclosure made in the application Ser. No. 13/797,440 is hereby incorporated by reference.

FIELD OF THE INVENTION

The invention relates to a preparation method of a power semiconductor device, in particular, the invention relates to a semiconductor device with a thick bottom metal and a preparation method thereof.

DESCRIPTION OF THE RELATED ART

Figure 1A:
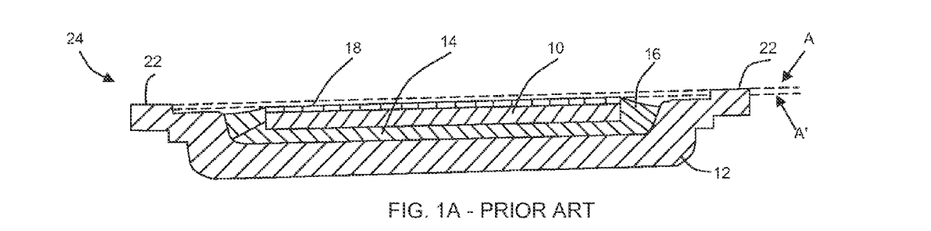
FIG. 1A-FIG. 1B are cross-sectional schematic diagrams of the existing semiconductor devices.

Generally, the power consumption of the power device is large; therefore part of metal electrodes of the device is exposed from a plastic package material encapsulating the semiconductor chip in the device to improve heat dissipation and the electrical performance of the device. For example, a US patent publication 2003/0132531A1 has disclosed a semiconductor package 24 with an exposed electrode at the bottom of the semiconductor chip applied in the surface mount technology. As shown in FIG. 1A, a power chip MOSFET (Metal-Oxide-Semiconductor Field Effect Transistor) 10 is located inside of a metal can 12 with its drain contact connected to the bottom of the metal can 12 via a layer of conductive silver epoxy 14. Can 12 also includes two rows of projections 22 located on two of its opposing edges, which are provided to make electrical contact with respective lands on a circuit board. As such the drain of MOSFET 10 is electrically connected to its place within a circuit through the projections 22 of the metal can 12. On the other hand, a source contact 18 and a gate contact 20 of the MOSFET 10 and the projections 22 are located on a surface of MOSFET 10 opposing its drain contact. A low stress and high adhesive epoxy 16 is deposited to fill in a gap around the MOSFET 10 and the can 12. Although the heat dissipation of the package 24 is improved, the metal can 12 has high cost of preparation in the actual production and it is difficult to accurately place the MOSFET 10 in the can 22.

Figure 1B:
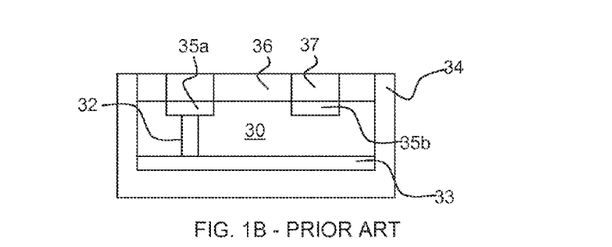

In another existing power devices as shown in FIG. 1B, Bonding pads 35a and 35b are formed at the front side of the MOSFET 30 and an electrode 33 at the back side of the MOSFET 30 is connected to the bonding pad 35a via an through via 32 filled with a conductive material. The MOSFET 30 is encapsulated by a plastic package layer 36 and a plastic package housing 34. The bonding pads 35a and 35b are electrically connected to an external circuit through metal bumps 37. However, in this power device, the electrode 33, which is a metal layer, is very thin with respect to the thickness of the housing 34, therefore the heat dissipation is poor.

It is within this context that embodiments of the present invention arise.

BRIEF DESCRIPTION OF THE DRAWINGS

As shown in attached drawing, the embodiment of the invention is more sufficiently described. However, the attached drawing is only used for explaining and illustrating rather than limiting the scope of the invention.

DETAILED DESCRIPTION OF THE PREFERRED EMBODIMENTS

Figure 2A:
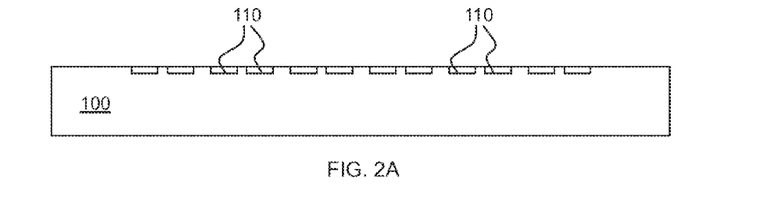
FIG. 2A-FIG. 2J are schematic diagrams illustrating a process of forming a thin semiconductor chip with a top plastic package layer at the front surface and a back metal layer at the back surface.

Referring to a cross-sectional view as shown in FIG. 2A, a semiconductor wafer 100 generally includes a plurality of semiconductor chips and a plurality of scribe lines at its front surface, where each scribe line is located between two adjacent semiconductor chips; therefore, the scribe line can be used as a reference target for cutting to separate individual semiconductor chips from the wafer. Furthermore, a plurality of metal pads 110 are formed at the front surface of each semiconductor chip for electrical connection to a power supply and the ground or a terminal in signal transmission with an external circuit, etc.

Figure 2B:
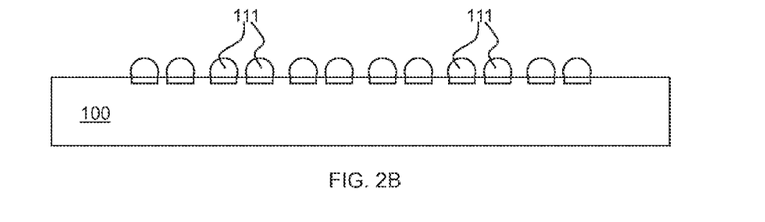
Figure 2C:
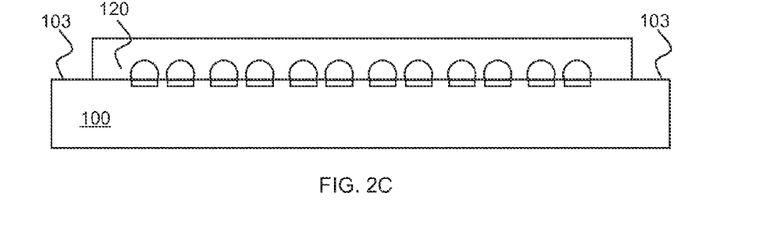

Commonly, a under bump metal (UBM) layer is formed on the metal pads 110 (not shown), such as Ni/Au layer. Metal balls or bumps 111 are deposited on the metal pads 110, as shown in FIG. 2B, for example, the metal bump can be a tin soldering ball, or copper block in spherical, cylindrical or wedge shape and the like. A first plastic package material is deposited to form a plastic package layer 120 covering the front surface of the wafer 100. The first plastic package material can be an epoxy resin and the like. In a preferred embodiment, the first plastic package layer 120 only covers the center area of the front surface of the wafer 100, not the whole front surface, as shown in FIG. 2C. The cross area of the first plastic package layer 120 is also a circle as the wafer 100 with the radius of the first plastic package layer 120 being smaller than that of the wafer, as such a first ring area 103 not covered by the first plastic package layer 120 is formed at the edge of the front surface of the wafer 100, and both ends of each scribe line are extended and exposed in the first ring area 103. As shown in FIG. 2C, the first plastic package layer 120 is completely encapsulated the metal bumps 111.

Figure 2D:
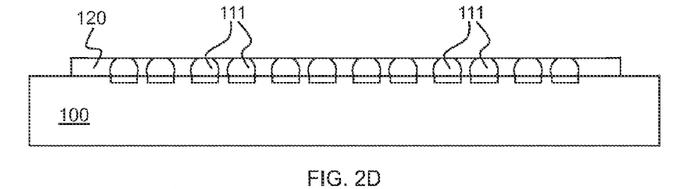
Figure 2E:
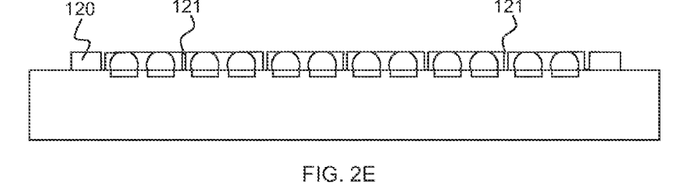
Figure 2F:
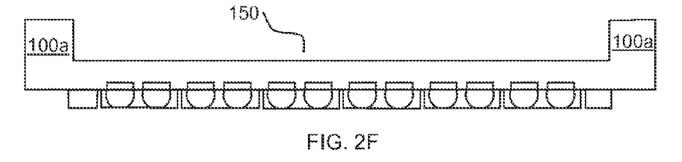

As shown in FIG. 2D, the first plastic package layer 120 is ground until the metal bumps 111 are exposed from the first plastic package layer 120. The first plastic package layer 120 is cut along a straight line formed by extending two ends of each scribe line exposed in the first ring area 103, as shown in FIG. 2E, forming a shallow groove used as a reference line 121. The mechanical strength of the wafer 100 is increased due to the physical support of the first plastic package layer 120, so that the wafer 100 can be thinned without breaking. In FIG. 2F, the wafer 100 is flipped and the center area of the back surface of the wafer 100 is ground by a grinding wheel (not shown) to form a recessed area 150 while the outermost area of the wafer 100 is not ground, thus a support ring 100a is formed at the edge of the back surface of the wafer 100. The radius of the recessed area 150 is smaller than that of the first plastic package layer 120, therefore the support ring 100a is partially overlapped with the first plastic package layer 120, as such the mechanical strength of the wafer is improved.

Figure 2G:
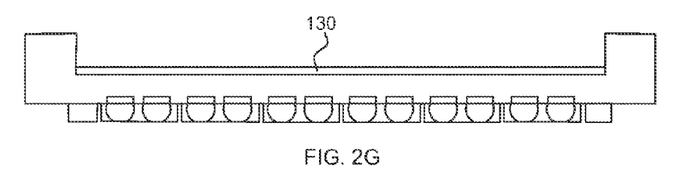
Figure 2H:
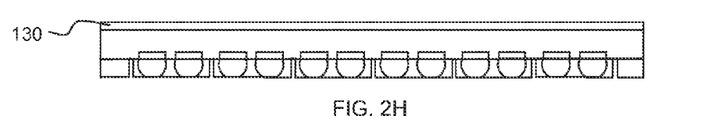
Figure 2I:
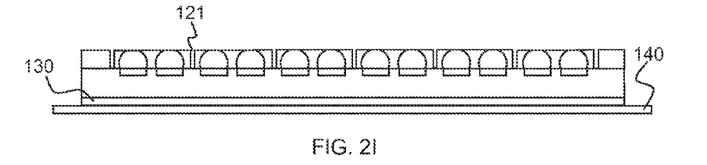
Figure 2J:
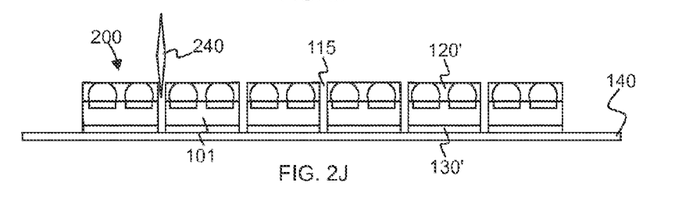

As shown in FIG. 2G and FIG. 2H, a metal layer 130 is deposited at the back surface of the thinned wafer, then, the support ring 100a is cut off, for example by laser cutting. As shown in FIG. 2I, the wafer 100 is flipped back and mounted with the metal layer is directly attached on an adhesive film 140. The first plastic package layer 120, the wafer 100 and the metal layer 130 are thus singulated along the reference line 121 forming notches 115 by a cutter blade 240, thus forming a plurality of individual semiconductor devices 200A, each of which includes a semiconductor chip 101 formed by cutting the wafer 100, a top plastic package layer 120' covering at the front surface of the chip 101 formed by cutting the first plastic package layer 120, and a bottom metal layer 130' located at the back surface of the chip 101 formed by cutting the metal layer 130. As a result, each device 200A comprises a chip 101, a top plastic package layer 120', a bottom metal layer 130' and metal bumps 111 formed on the pad 110 of the chip 101, where the top plastic package layer 120' surrounds the sidewalls of metal bumps 111 with the top of the metal bumps 111 are exposed from the top plastic package layer 120'.

Figure 3A:
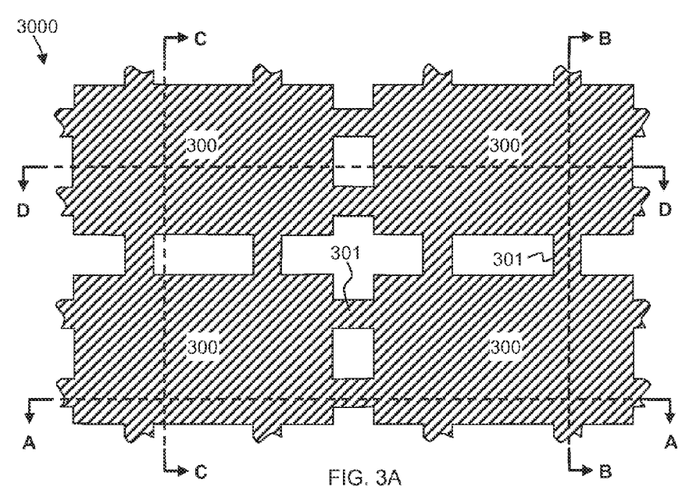
FIG. 3A is a top view of a first lead frame.
Figure 3B:
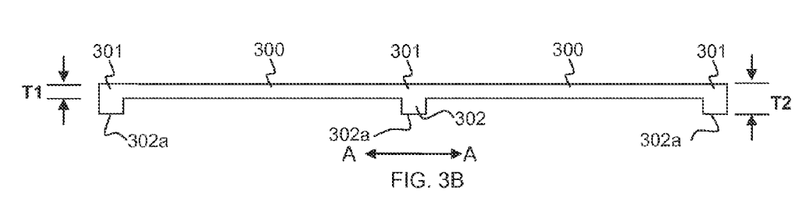
FIG. 3B-FIG. 3E are cross sectional views of the lead frame in FIG. 3A.
Figure 3C:
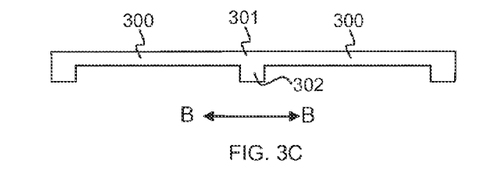
Figure 3D:
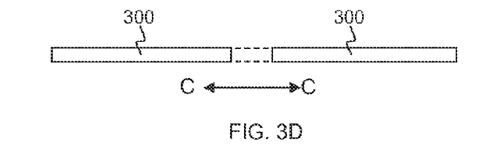
Figure 3E:
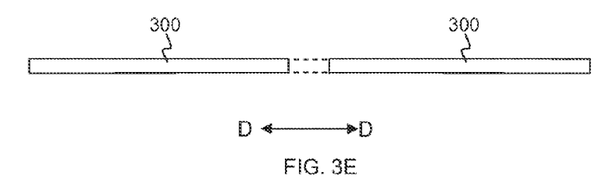

In FIG. 3A, the lead frame 3000 comprises an array of a plurality of die paddles 300, where the adjacent die paddles 300 are connected together by one or more connecting parts 301 with the top surfaces of the connecting parts 301 and the die paddles 300 being coplanar, where each connecting part 301 comprises a support part 302 extending in the opposite direction from the front surface of the lead frame 3000 with the bottom surfaces 302a of all support parts 302 are coplanar. FIGS. 3B, 3C, 3D and 3E are cross sectional views of the lead frame 3000 along lines AA, BB, CC and DD. The thickness T1 between the front and back surface of the die paddle 300 is less than the thickness T2 between the top and bottom surfaces of the support part 302.

Figure 4A:
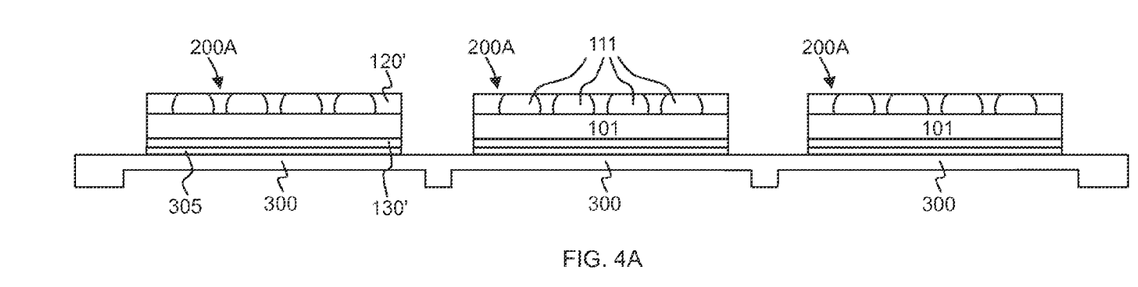
FIG. 4A-FIG. 4D are cross sectional schematic diagrams illustrating a method of forming a semiconductor device with thick bottom metal using the first lead frame in FIG. 3A.
Figure 4B:
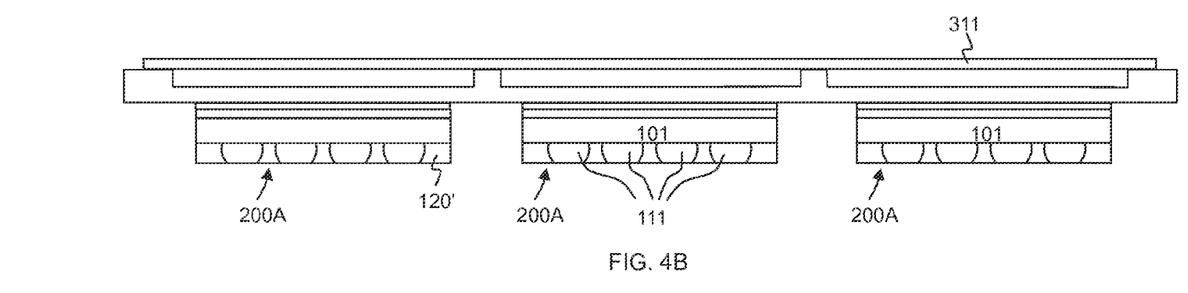
Figure 4C:
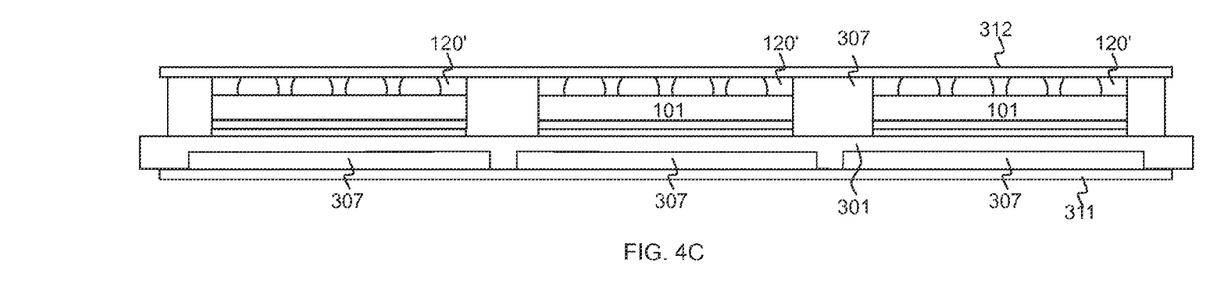

In FIG. 4A, each semiconductor device 200A is mounted on the front surface of each dies paddle 300 with the back metal layer 130' directly mounted on the front surface of the die paddle 300 using an adhesive material 305. As shown in FIG. 4B, the lead frame 3000 with the devices 200A mounted on its front surface is flipped and then a first adhesive film 311 is attached on the bottom surface 302a of each support part 302. The lead frame 3000 with the devices 200A and the adhesive film 311 is flipped back, and a second adhesive film 312 is attached on the top surfaces of the top plastic package layer 120' and metal bumps 111. In fact, in the step of plastic molding, the flat adhesive films 311 and 312 are placed inside a mold cavity of the molding equipment against the top wall and bottom wall of the mold cavity respectively. Then the lead frame with the devices 200A is placed inside the mold cavity, thus the adhesive films 311 is pressed to attach on the bottom surface of the support parts 302 of the connecting parts 301 and the adhesive film 312 is pressed to attach on the top surfaces of the first plastic package layer 120' and the metal bumps 111. A plastic package material is then injected in the empty space between the adhesive films 311 and 312 and then is cured by heating to form a plastic package body 307 as shown in FIG. 4C. The plastic package body 307 covers the die paddles 300, the connecting part 301 and the sidewalls of the devices 200A with the upper surface of the top plastic package layer 120' and the metal bumps 111 and the bottom surface 302a of the support part 302 exposing from the plastic package body 307. The plastic package material in a molten state before curing is very easily invaded into the space between the upper surfaces of the top plastic package layer 120' and the metal bumps 111 and the adhesive film 312 thus covering the top surfaces of the top plastic package layer 120' and the metal bumps 111; therefore, the plastic package body 307 is slightly ground from its top surface to expose the top surfaces of the top plastic package layer 120' and the metal bumps 111. After the adhesive films 311 and 312 are removed, as shown in FIG. 4D, the plastic package body 307 and the connecting part 301 between two adjacent die paddles 300 is cut off to separate the plastic package body 307, die paddles 300 and the semiconductor devices 200A, each of which includes a chips 101 with the top plastic package layers 120' and the back metal layers 130', forming a plurality of individual semiconductor devices 350.

The adhesive film 311 can be attached on the bottom surface 302a of the lead frame 3000 before the semiconductor devices 200A are mounted on the die paddle 300 of the lead frame 3000. Alternatively, the adhesive film 311 can be attached on the bottom surfaces 302a inside the mold cavity after the semiconductor devices 200A are mounted on the die paddles 300 of the lead frame 3000 as described above. However, the adhesive film 312 can only be attached on the upper surface of the top plastic package layers 120' and the metal bumps 111 inside the mold cavity after the semiconductor devices 200A are mounted on the die paddles 300 of the lead frame 3000 as described above.

Figure 4D:
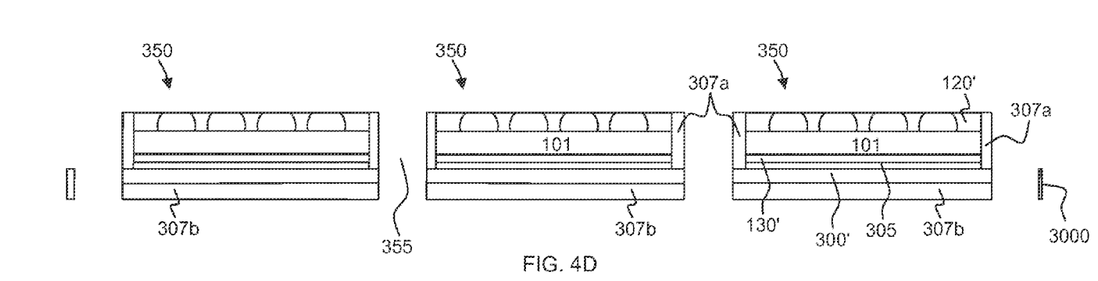
Figure 6A:
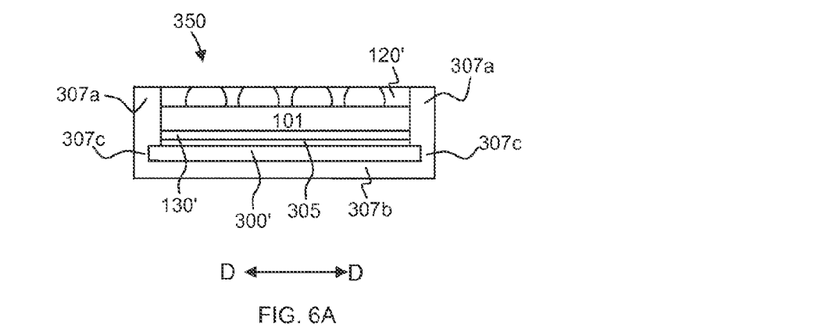
FIG. 6A-FIG. 6B are cross sectional schematic diagrams of a semiconductor device formed by the first lead frame in FIG. 3A.
Figure 6B:
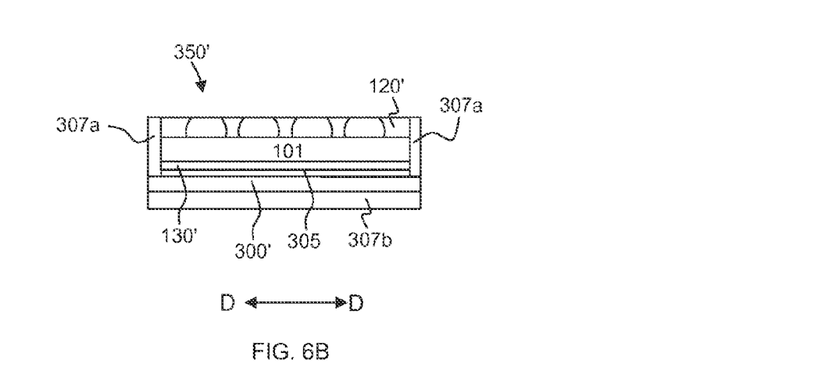

FIG. 4D is a cross sectional view of the semiconductor devices 350 along the dotted line AA in the FIG. 3A and FIGS. 6A-6B are the cross sectional views of the semiconductor devices 350 along the dotted line DD in FIG. 3A. A first plastic package body portion 307a surrounding the sidewalls of the semiconductor device 200A, i.e., surrounding the sidewalls of the semiconductor chip 101, the top plastic package layer 120' and the back metal layer 130'. In general, the width of the notch 355, which depends on that of the cutting blade, is designed whether the sidewall of the die paddle 300 is covered with the plastic package body 307 after the cutting. For example, in FIG. 6A, the plastic package body 307 covered the sidewalls of each die paddle 300 is not completely cut off, thus forming a second plastic package body portion 307c surrounding the sidewalls of the die paddle 300, where the first plastic package body portion 307a is thicker than the second plastic package body portion 307c. The back surface of each die paddle 300 is also covered with a bottom plastic package layer 307b. As shown in FIG. 6A, the first plastic package body portion 307a, the second plastic package body portion 307c and the bottom plastic package layer 307b form a continuance structure. In another embodiment, as shown in FIG. 6B, the plastic package body 307 covering the sidewalls of each metal die paddle 300 in the semiconductor device 350' is cut completely, therefore the sidewalls of the die paddle 300 is not covered by the plastic package body 307, and the first plastic package body portion 307a is separated from the bottom plastic package layer 307b by the die paddle 300. In the embodiment shown in FIGS. 6A-6B, the die paddle 300 cannot be used as the contact end in electrical connection to the external circuit. In this case, the semiconductor chip 101 can be a common drain double-MOSFET type vertical power device.

Figure 5A:
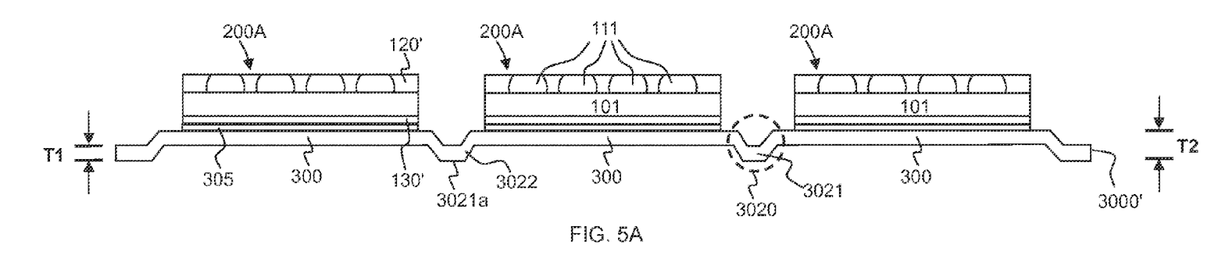
FIG. 5A-FIG. 5C are schematic diagrams illustrating a alternative lead frame and the method of forming a semiconductor device with thick bottom metal using the alternative lead frame.
Figure 5B:
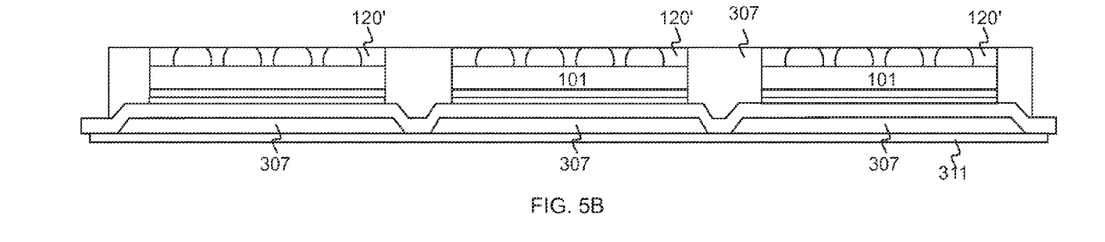
Figure 5C:
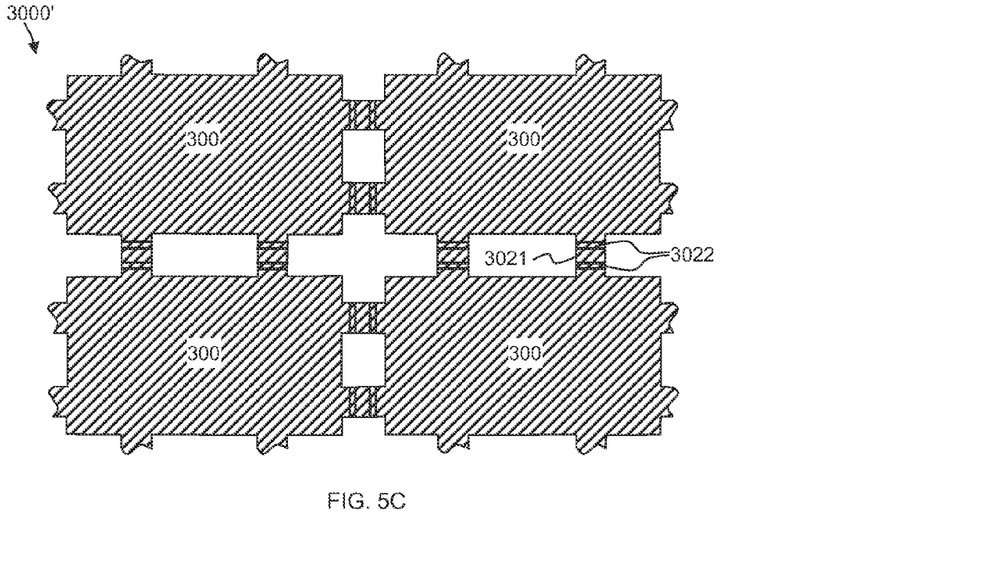

In the embodiment shown in FIGS. 4A-4D the lead frame 3000 can be prepared by etching a metal panel with an original thickness T2 forming the die paddles 300 of a thickness T1, where T2 is thicker than T1, as such, the connecting part 301 and the support part 302 are in a "T-shaped" structure. In another embodiment shown in FIGS. 5A-5B, the lead frame 3000' can be prepared by printing or punching a metal panel with an original thickness of T1 at the connecting part locations. In FIG. 5A, the support part 3020 of the connecting part has a trench structure and includes a bottom part 3021 parallel to the die paddle 300 and two sidewalls 3022 connected to the both sides of the bottom part 3021, where the bottom part 3021 includes a bottom surface 3021a. The thickness T1 of the lead frame 3000' is less than the distance T2 between the bottom surface 3021a and the top surface of the die paddle 300. FIG. 5C is a top view of the lead frame 3000'. The support part 3020 is then cut in a subsequent step similar as described above in FIG. 4D.

FIGS. 7A-7E are schematic diagrams of a lead frame 4000 according to another embodiment of the present invention. The top view of lead frame 4000 is similar as that of the lead frame 3000 in FIG. 3. However, in this embodiment, the thickness of the die paddle 300 in the lead frame 4000 is equal to the distance T2 between the bottom surface 302a of the support part 302 and the front surface of the die paddle 300. In other words, the back surface of the die paddle 300 is coplanar with the bottom surface 302a. FIGS. 7B-7E are cross sectional views of the lead frame 4000 along the dotted lines AA, BB, CC and DD shown in FIG. 7A. The lead frame 4000 can be prepared by etching a metal panel with original thickness of T2.

Figure 7A:
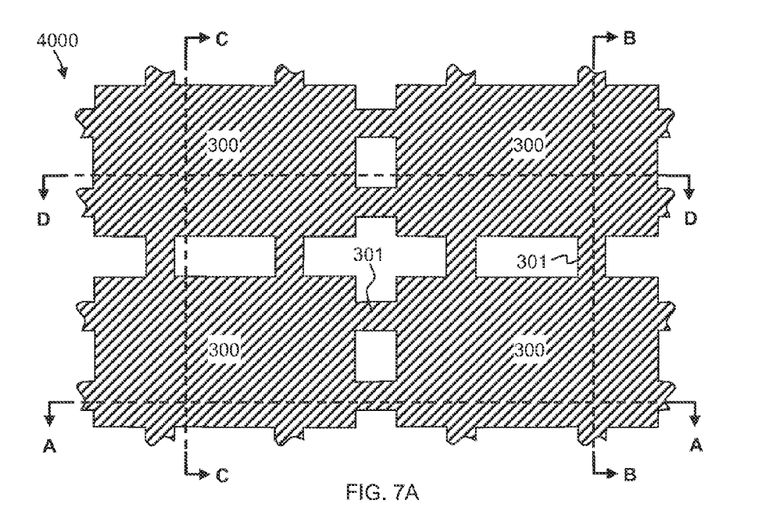
FIG. 7A is a top view of a second lead frame.
Figure 7B:
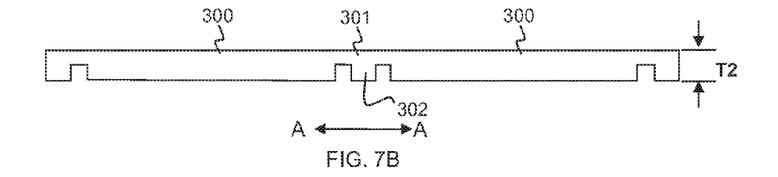
FIG. 7B-FIG. 7E are cross sectional views of the lead frame in FIG. 7A.
Figure 7C:
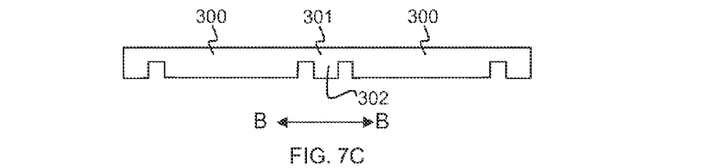
Figure 7D:
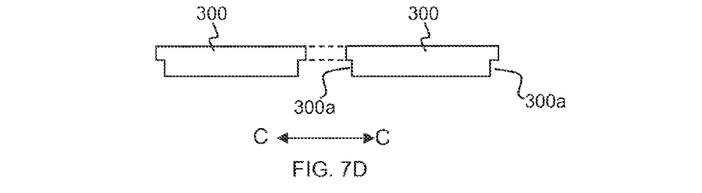
Figure 7E:
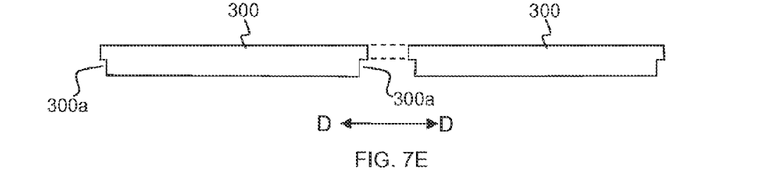
Figure 8A:
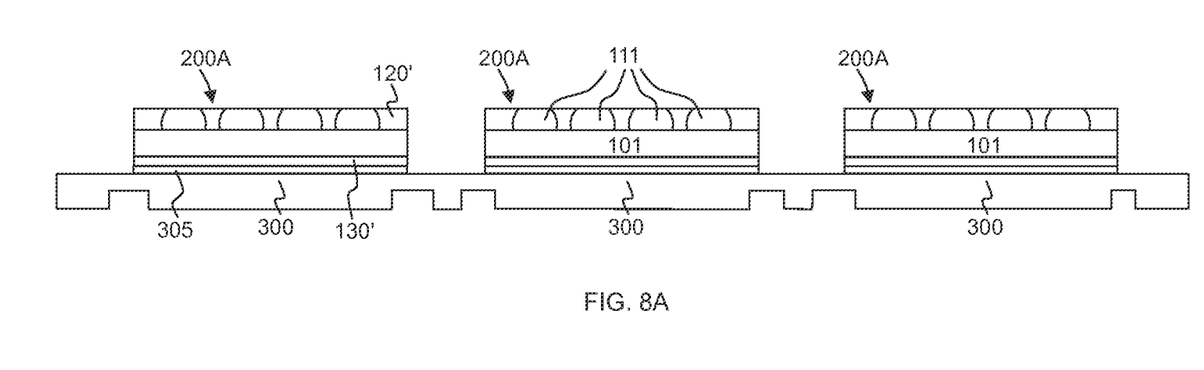
FIG. 8A-FIG. 8D are cross sectional schematic diagrams illustrating a method of forming a semiconductor device with thick bottom metal using the second lead frame in FIG. 7A.
Figure 8B:
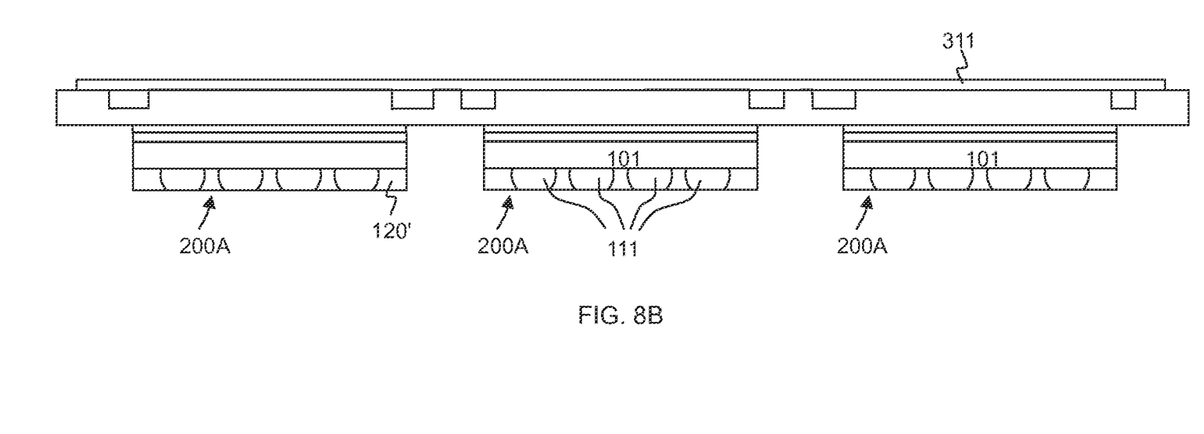
Figure 8C:
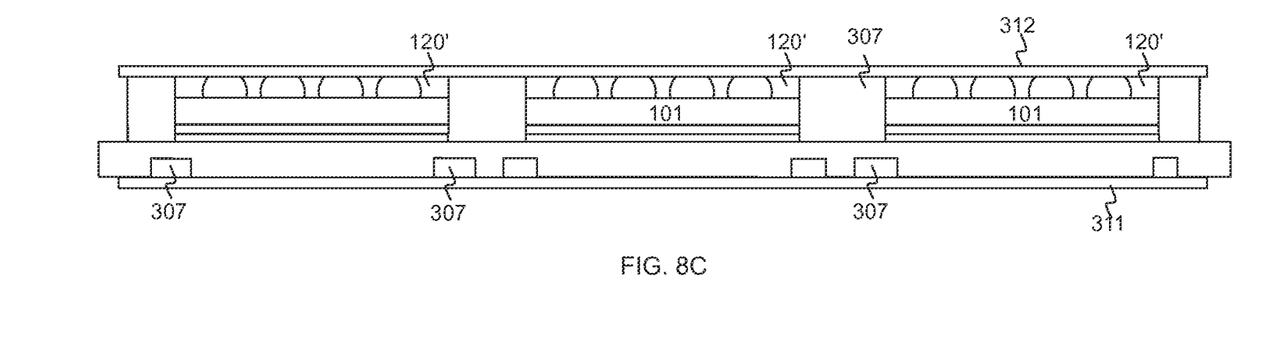
Figure 8D:
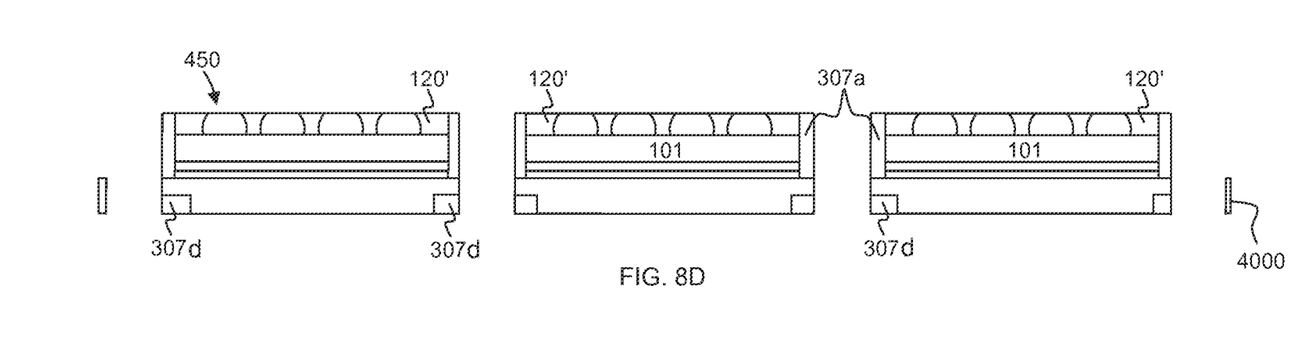
Figure 9A:
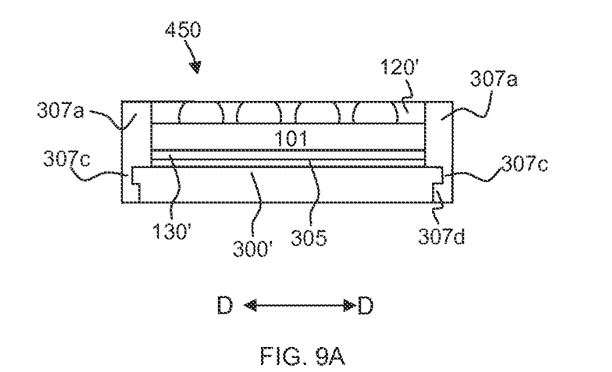
FIG. 9A-FIG. 9B are cross sectional schematic diagrams of a semiconductor device formed by the second lead frame in FIG. 7A.
Figure 9B:
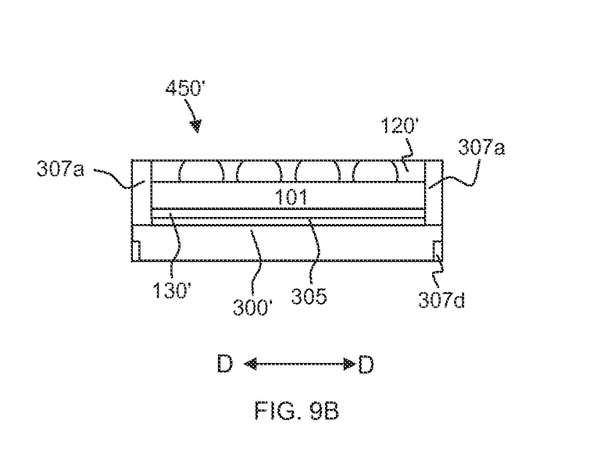

In this embodiment, a groove 300a is formed at the edge of the back surface of each die paddle 300, as shown in FIG. 7D-FIG. 7E. FIG. 8A-FIG. 8D are the schematic diagrams of a method of preparing the semiconductor device using the lead frame 4000, which is similar as that shown in FIGS. 4A-4D. However, in this embodiment, the plastic package body 307 is not covered the back surface of the die paddle 300. Furthermore, in the step of separating individual semiconductor devices, the plastic package body 307 filled in the groove 300a is cut off forming a ring plastic package body 307d surrounding the sidewalls of the bottom portion of the die paddle 300. FIGS. 9A-9B are cross sectional views of a semiconductor device 450 along the direction of the dotted line DD in FIG. 7A. As shown in FIG. 9A, the final semiconductor device 450 includes a first plastic package body portion 307a covering the sidewall of the device 200A, i.e., covering the sidewalls of the chip 101, the top plastic package layer 120' and the back metal layer 130', a second plastic package body portion 307c covering the sidewall of the top portion of the die paddle 300, where the first plastic package body portion 307a and the second plastic package body portion 307c are continuance with the first plastic package body portion 307a being thicker than the second plastic package body portion 307c, and a ring plastic package body 307d surrounding the sidewall of the bottom portion of the die paddle is continuance to the second plastic package body portion 307c. In other words, the first plastic package body portion 307a, the second plastic package body portion 307c and the ring plastic package body 307d form a continuance structure. Alternatively, as shown in FIG. 9B, the plastic package body 307 covering the sidewall of the die paddle 300 is cut off completely, thus the sidewall of top portion of the die paddle 300 is not covered with the plastic package body 307c. In this case, the semiconductor device 450' only includes the first plastic package body portion 307a and the ring plastic package layer 307d, where the first plastic package body portion 307a is separated from the ring plastic package layer 307d by the top portion of the die paddle 300. In this embodiment, the back surface of the die paddle 300 is exposed as a contact end for electrical and mechanical connection to the external circuit. In a preferred embodiment, the chip 101 is a vertical power MOSFET with the current flowing from the front to the back of the device or vice versa, where the plurality of metal pads 110 includes the source and gate electrodes and the bottom metal layer 130' includes the drain electrode.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A semiconductor device with thick bottom metal comprising:
   a semiconductor chip covered with a top plastic package layer at its front surface and a back metal layer at its back surface, wherein a plurality of metal bumps are formed at the front surface of the semiconductor chip, and the top plastic package layer surrounds sidewalls of the metal bumps with a top surface of the metal bumps exposing from the top plastic package layer;
   a die paddle, wherein the semiconductor chip is mounted on the die paddle with the back metal layer being directly attached on a front surface of the die paddle and a side surface of the die paddle is exposed;
   a bottom plastic package layer covering a back surface of the die paddle; and
   a first plastic package body portion covering the sidewalls of the semiconductor chip, the top plastic package layer and the back metal layer, wherein the first plastic package body is separated from the bottom plastic package layer by the die paddle.

2. The semiconductor device with thick bottom metal of claim 1 further comprises a second plastic package body portion covering sidewalls of the die paddle, wherein the first plastic package body portion, the second plastic package body portion and the bottom plastic package layer form a continuance structure.

3. A semiconductor device with thick bottom metal comprising:
   a semiconductor chip covered with a top plastic package layer at its front surface and a back metal layer at its back surface, wherein a plurality of metal bumps are formed at the front surface of the semiconductor chip, and the top plastic package layer surrounds sidewalls of the metal bumps with a top surface of the metal bumps exposed from the top plastic package layer;
   a die paddle, wherein the semiconductor chip is mounted on the die paddle with the back metal layer being directly attached on a front surface of the die paddle, wherein a sidewall of a top portion of the die paddle is exposed;

a ring plastic package body surrounding a center portion of a bottom surface of the die paddle formed by filling a plastic package material into a recess ring formed at an edge of the back surface of the die paddle; and a first plastic package body portion covering the sidewalls of the semiconductor chip, the top plastic package layer and the back metal layer, wherein the first package body is separated from the ring plastic package body by the top portion of the die paddle.

4. The semiconductor device with thick bottom metal of claim 3 further comprises a second plastic package body portion covering at least a sidewalls of a top portion of the die paddle, wherein the first plastic package body portion, the second plastic package body portion and the ring plastic package body form a continuance structure.

\* \* \* \* \*